United States Patent [19]

Rachwal et al.

[11] Patent Number: 4,894,679
[45] Date of Patent: Jan. 16, 1990

[54] METHOD AND APPARATUS FOR USE IN TRANSFERRING AN IMAGE

[75] Inventors: Ervin J. Rachwal, Sarasota; George deClaire, Bradenton; Frederick J. Elia, Sarasota, all of Fla.

[73] Assignee: Graphics LX Corp., Sarasota, Fla.

[21] Appl. No.: 202,794

[22] Filed: Jun. 3, 1988

[51] Int. Cl.$^4$ ............................................. G03G 15/00
[52] U.S. Cl. ...................................... 355/18; 355/202; 355/243; 430/48; 430/54
[58] Field of Search ................... 355/243, 202, 18, 19, 355/123, 89, 99; 430/48, 54, 31, 42

[56] References Cited

U.S. PATENT DOCUMENTS

| | | | |
|---|---|---|---|
| 3,227,549 | 1/1966 | Ullrich, Jr. et al. | 430/54 X |
| 3,810,694 | 5/1974 | Harrell et al. | 355/18 |
| 3,966,317 | 6/1976 | Wacks et al. | 355/99 X |
| 4,048,921 | 9/1977 | Raschke | 355/18 X |
| 4,143,118 | 3/1979 | Laing | 355/18 X |
| 4,423,955 | 1/1984 | Powers | 355/99 |
| 4,537,490 | 8/1985 | Stoudt | 430/54 X |
| 4,571,073 | 2/1986 | Diedrich et al. | 355/89 |
| 4,679,931 | 7/1987 | Sueda et al. | 355/243 X |

OTHER PUBLICATIONS

Publication entitled "Kodak Products for Electrophotography", Kodak Publication No. G-95, Eastman Kodak Company, 1981.

Publication entitled "Chemco News-Plater 2500", published by Chemco Systems Co. prior to Jun. 3, 1988.

Primary Examiner—A. C. Prescott
Attorney, Agent, or Firm—Tarolli, Sundheim & Covell

[57] ABSTRACT

An improved method and apparatus for use in exposing of photosensitive material to ultraviolet radiation includes a carrier which is a film strip having a photoconductive layer. The film strip is indexed along a path which extends through a linear array of stations. At a charging station an electrostatic charge is applied to the photoconductive layer on the film strip. At an exposing station, the photoconductive layer on the film strip is exposed to a light pattern which forms a reduced size image of an original to thereby render areas of the photoconductive layer conducting. At a developing station, toner particles are electrically attracted to the conducting areas of the photoconductive layer on the film strip. The toner particles are fused to each other and the material of the film strip to form a permanent visible image. The film strip is then indexed to an exposing station where ultraviolet radiation is directed through the film strip to protect an enlarged image onto photosensitive material. The ultraviolet radiation has an energy level of at least 500 ergs per square centimeter at the surface of the photosensitive material to initiate a photochemical reaction in the photosensitive material so that the image of the original on the film strip is transferred to the photosensitive material.

71 Claims, 5 Drawing Sheets

METHOD AND APPARATUS FOR USE IN TRANSFERRING AN IMAGE

BACKGROUND OF THE INVENTION

The present invention relates to a method and apparatus for transferring an image of an original to photosensitive material.

Current plate making practice in many printing plants is to make a paste-up copy which is photographed to produce a full sized image on film as a negative. The silver halide film must be developed in a separate processor. The developed film negative then must be placed in contact with the unexposed plate in a vacuum frame. The plate is then exposed to high intensity ultraviolet radiation which causes a photochemical reaction to take place on the surface of the plate. The film is then removed and the plate is further prepared by developing (offset lithography) or wash out (letterpress/flexo) operation.

Another known method of making printing plates includes providing a plate which is coated with an organic photoconductive layer. The photoconductive layer is charged and then exposed to a paste-up copy which is projected onto the plate surface. Background areas of the image reflect light and discharge the plate. As soon as the plate exposure is finished, the plate is moved into a processor where a liquid dispersant containing positively charged toner particles is applied to the surface of the plate. The toner particles adhere to negatively charged areas of the plate. After being dried, the toner particles on the plate are fused together and bonded to the surface of the plate. After decoating, rinsing and gumming, the plate is ready for use in a printing press.

The consumable materials used in these known processes are relatively expensive. Thus, silver halide film in full size is expensive as are chemicals used in developing it. If electrostatic plates are used, they are relatively expensive compared to conventional offset plates. In addition, these known processes are relatively slow in going from paste-up to completed plate. The quality of the image obtained on the completed plate, although it may be considered as being acceptable, may be of lesser quality than desired. In the addition, the apparatus used to practice these known processes requires a relatively large amount of space and is difficult to automate so that it can be operated with a minimum of personnel.

BRIEF DESCRIPTION OF THE INVENTION

The present invention provides a new and improved method and apparatus for use in transmitting an image from an original to a plate of photosensitive material. The photosensitive material may be disposed on a base or plate and be used in the making of an article such as a printing plate or printed circuit board. To transfer the image from an original to a plate of photosensitive material, a carrier is moved along a path which extends through a linear array of stations. An image of an original may be formed on the carrier in many different ways. In one embodiment of the invention, the image was formed on the carrier by electrophotographic methods.

When electrophotographic methods are used to form an image on the carrier, the linear array of stations includes a charging station at which an electrostatic charge is applied to the film strip. At an exposure station, a photoconductive layer on the carrier is exposed to a light pattern which forms a reduced size image corresponding to an original. The light pattern renders areas of the photoconductive layer electrically conducting to discharge them. At a developing station, toner particles are electrically attracted to discharged areas of the photoconductive layer on the carrier to form a visible image. The toner particles are fused with the material of the photoconductive layer to make the visible image permanent.

At a transfer station, radiation is directed through the carrier to project an enlarged image onto photosensitive material. The quality of the image formed on the photosensitive material is enhanced by exposing the photosensitive material to ultraviolet radiation at the transfer station. In order to cause a photochemical reaction to take place in the photosensitive material, the ultraviolet radiation has an energy level of at least 500 ergs per square centimeter at the surface of the photosensitive material.

Although many different types of carriers could be used, in one embodiment of the invention, the carrier is a film strip which extends from a supply roll through the linear array of stations to a storage roll. Since a permanent image is formed on the film strip, the film strip can later be unwound from the storage roll and used to form a second image on photosensitive material. The cost of transferring the copy of an original to the plate of photosensitive material is relatively low since the materials which are consumed in the process are relatively inexpensive. The linear array of stations through which the film strip passes is compact and is easily adapted to computer controls so that the apparatus can be operated by a minimum number of personnel having minimal skills.

Accordingly, it is an object to this invention to provide a new and improved method and apparatus for transferring images of originals to photosensitive material and wherein an image of an original is formed on a carrier and transferred by transmitting radiant energy through the carrier to photosensitive material with an energy level of at least 500 ergs per square centimeter at the surface of the photosensitive material.

Another object of this invention is to provide a new and improved method and apparatus for transferring an image of an original to photosensitive material and wherein an image of an original is formed on a carrier and is transferred by transmitting ultraviolet light through the carrier to photosensitive material.

Another object of this invention is to provide a new and improved method and apparatus for transferring images of originals to photosensitive material and wherein an electrostatic charge on a carrier is developed to form a visual image, and the visual image is transferred to a plate of photosensitive material by directing radiation through the carrier.

Another object of this invention is to provide a new and improved method and apparatus for transferring an image of an original to a plate of photosensitive material and wherein a photoconductive layer on a film strip is exposed to a light pattern which forms an image which is a function of the original to render areas of the photoconductive layer electrically conductive and wherein toner particles are electrically attracted to the conducting areas and fused to the photoconductive layer on the film strip.

BRIEF DESCRIPTION OF THE DRAWINGS

The foregoing and other objects and features of the invention will become more apparent upon a consideration of the following description taken in connection with the accompanying drawings wherein.

DESCRIPTION OF SPECIFIC PREFERRED EMBODIMENTS OF THE INVENTION

General Description

Figure 1:
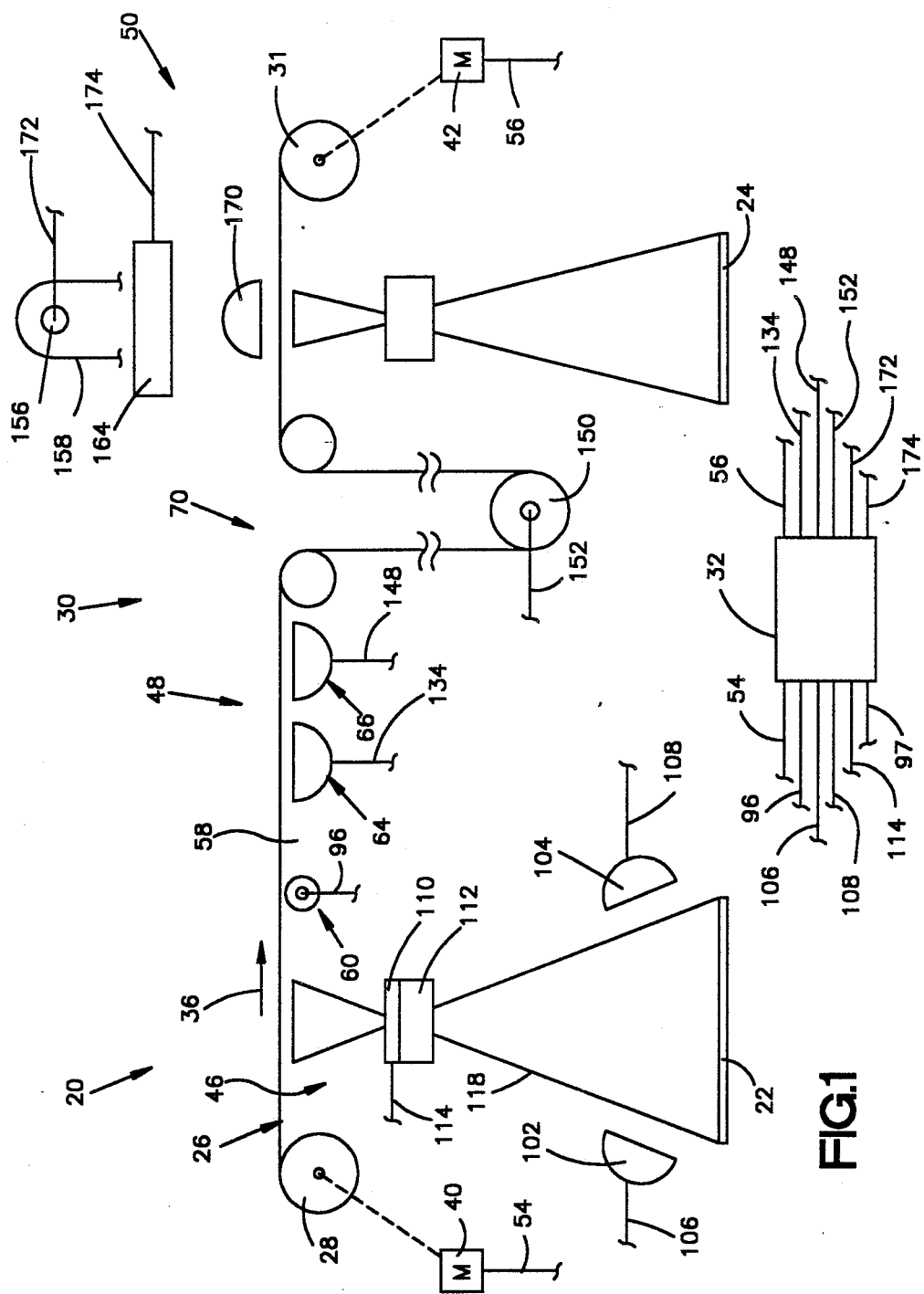
FIG. 1 is a schematic illustration of an apparatus which is used to transfer images of originals to photosensitive material.

An apparatus 20 for transmitting an image of an original 22 to photosensitive material 24 is illustrated schematically in FIG. 1. A carrier 26 is used in transferring an image from the original 22 to the photosensitive material 24. In the illustrated embodiment of the invention, the carrier is a film strip 26 which extends from a cylindrical supply roll 28 through a linear array 30 of processing stations to a cylindrical storage roll 31. It should be understood that the carrier 26 could be one or more plates or sheets of material or other articles having a structure which is different than the film strip. However, the film strip is the presently preferred embodiment of the carrier 26.

The linear array 30 of processing stations facilitates constructing the apparatus 20 in modules. The modules can be interconnected and in a minimum of space in many different environments. The relatively compact apparatus 20 can be automated by the use of computer controls 32 to allow the apparatus to be operated by a minimum number of personnel having relatively little training.

Although the apparatus 20 can be used for making many different articles, it is advantageously used for making printing plates. The printing plates are mounted in a press and used to print newspapers or other sheet material items in a known manner. When the apparatus 20 is used to form printing plates, the original 22 will be paste-up copy and the photosensitive material 24 will be a layer of photosensitive material supported on a base or plate. However, it should be understood that the apparatus 20 can be used to produce printed circuit boards and other items. It should also be understood that the body of photosensitive material 24 can be supported in other ways if desired.

Figure 2:
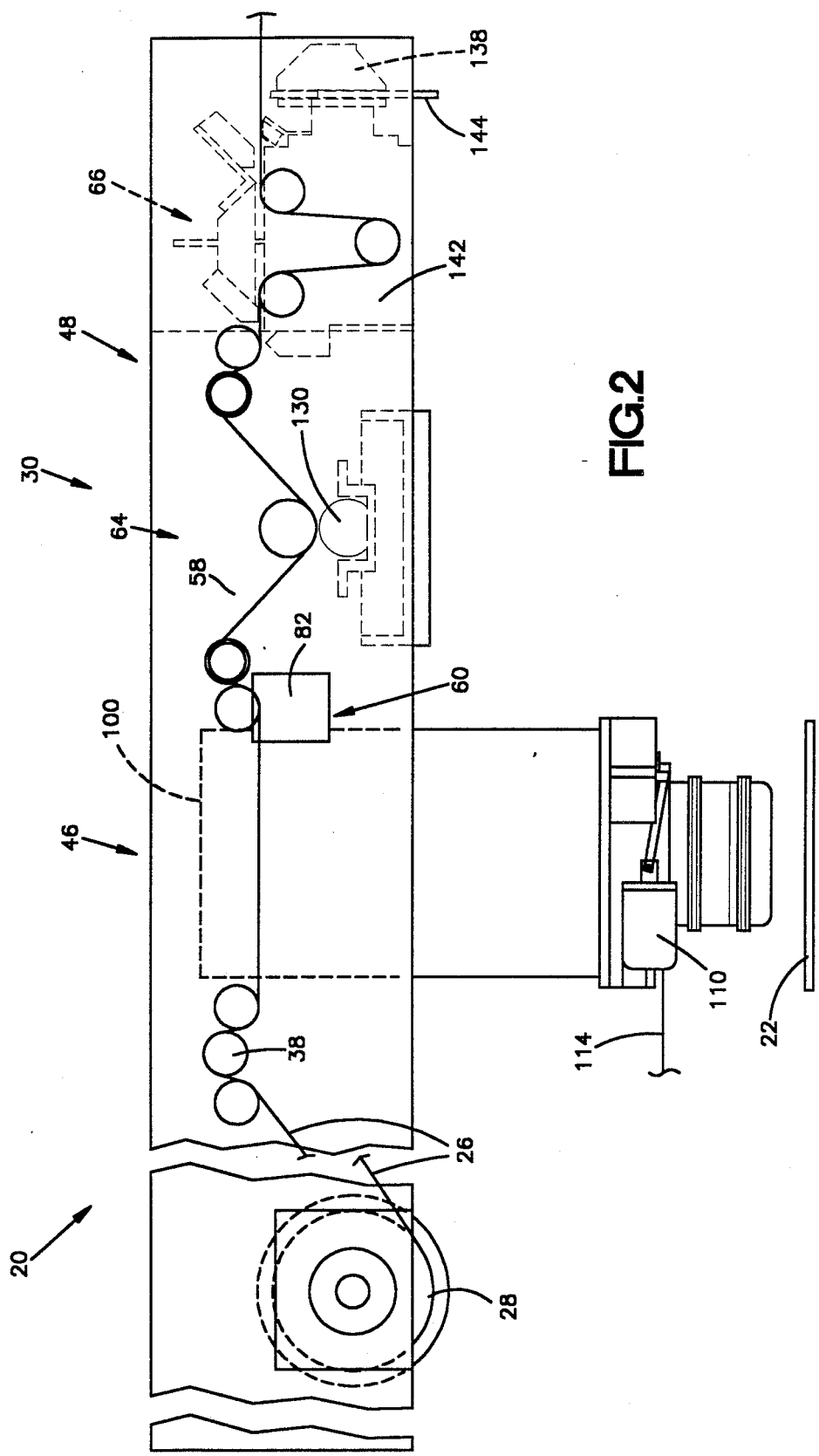
FIG. 2 is a simplified illustration depicting the path of a carrier, which may be a film strip, through a charging station, an exposure station, and a developing station.

The film strip 26 is indexed in both a forward direction (indicated by an arrow of 36 and FIG. 1) and a reverse direction from the supply roll 28 along a path extending through the linear array 30 of stations to the storage roll 31 by operation of reversible motors (not shown) connected with drive sprockets including a drive sprocket 38 (FIG. 2). The drive sprocket 38 is rotated to sequentially index segments of the film strip 26 through each of the stations in the linear array 30 of stations. The speed and direction of rotation of the drive sprocket 38 (FIG. 2) can be varied to vary the speed of movement of the film strip 26. A pair of motors 40 and 42 (FIG. 1) are continuously energized to tension the film strip by urging the supply and storage rolls 28 and 31 in their windup directions.

Figure 3:
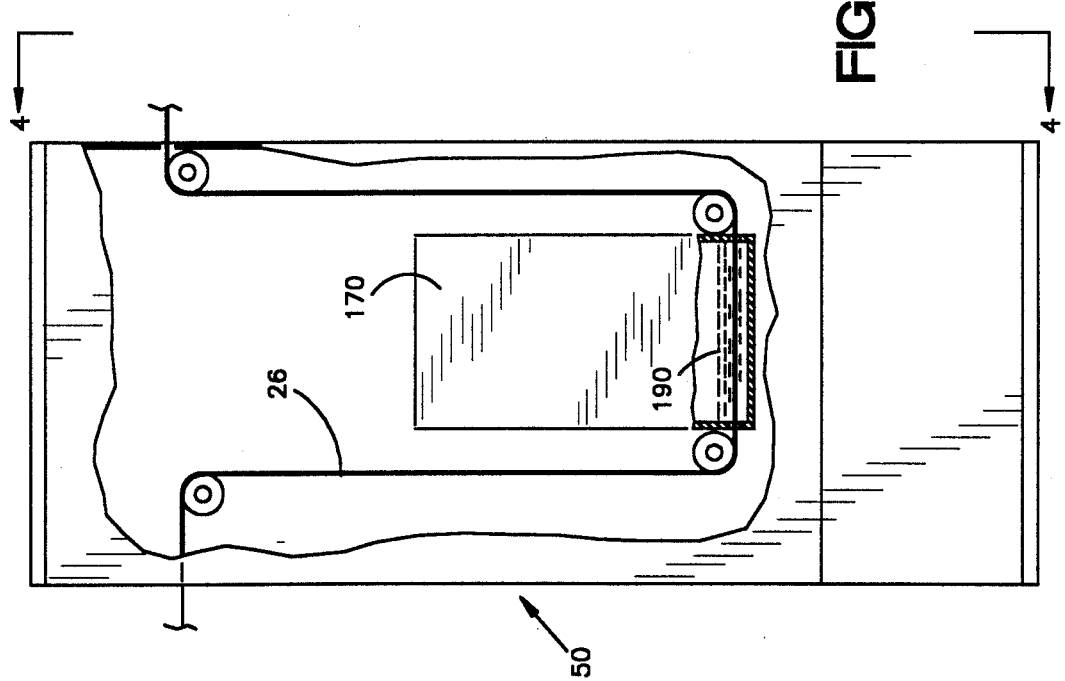
FIG. 3 is a simplified view depicting the path of the film strip through a transfer station.
Figure 4:
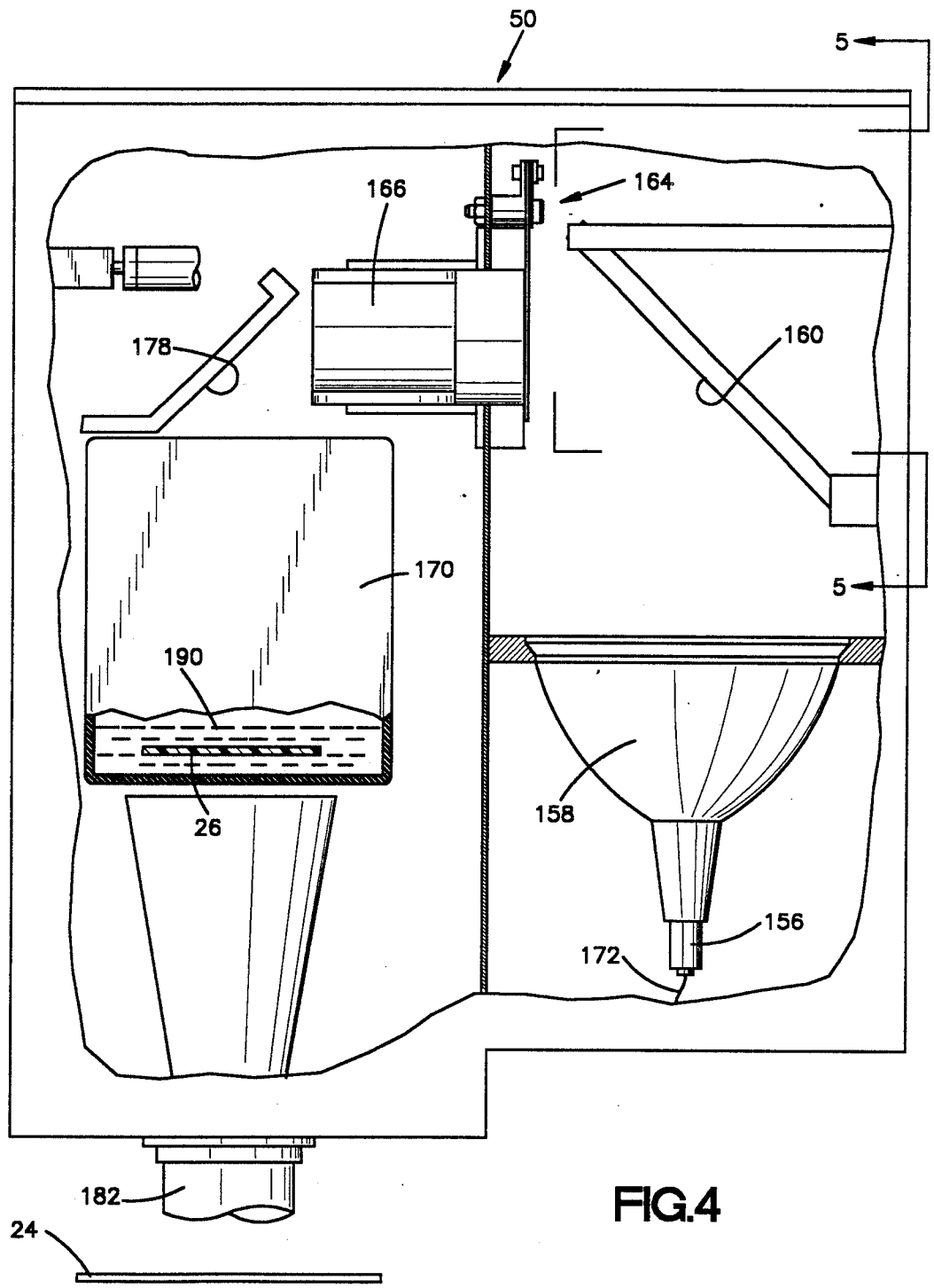
FIG. 4 is a broken away view, taken generally along the line 4—4 of FIG. 3, illustrating the relationship between a source of radiation and the film strip.

A reduced size image of the original 22 is projected onto a segment of the film strip 26 at an exposure station 46 (FIGS. 1 and 2). The image of the original 22 is developed on the film strip 26 at a developing station 48 (FIGS. 1 and 2) to form a visible intermediate image on the film strip. An enlargement of the intermediate image on the film strip is projected onto the plate 24 of photosensitive material at a transfer station 50 (FIGS. 1, 3, and 4). After passing through the transfer station 50, the film strip 26, with the intermediate image of the original thereon, is wound onto the storage roll 31.

The operation of the apparatus in the linear array 30 of stations 46, 48, 50 is regulated by the computer controls 32. In addition, the operation of the motors 40 and 42 is regulated by the computer controls 32 to control the tension in the film strip 26. Thus, the motor 40 is connected with the computer controls 32 by a lead indicated schematically at 54 in FIG. 1 and the motor 42 is connected with the computer controls by a lead indicated schematically at 56. The computer controls 32 regulate the direction and speed of operation of the motor connected to the main drive sprocket 38 to move the film strip 26 against the influence of one of the motors 40 or 42 with the assistance of the other motor.

In accordance with one of the features of the invention, the film strip 26 can be used to subsequently produce another printing plate having an image corresponding to a selected original 22 without re-exposing the selected original. When this is to be done, the computer controls 32 operate the motor connected to the main drive sprocket 38 to rotate the sprocket at a high speed in the reverse direction. During reverse rotation of the drive sprocket 38, the motors 40 and 42 rapidly unwind the film strip 26 from the storage roll 31.

The film strip 36 is moved at a relatively high rate of speed through the linear array 30 of stations until the film segment upon which a copy of a selected original is disposed is at the transfer station 50. An image of the selected original is then transferred, for a second time, from the film strip 26 to photosensitive material 24. The controls 32 then effect rotation of the drive sprocket 38 to quickly wind the film strip 26 back onto the storage roll 31.

During operation of the apparatus 20 to sequentially transfer images of a plurality of originals 22 to a plurality of plates 24 of photosensitive material, the film strip 26 is incrementally indexed by and maintained under a constant tension by operation of the main drive sprocket 38 and motors 40 and 42. This sequentially moves adjacent segments of the film strip 26 from the supply roll 28 through each of the stations 46, 48, and 50. Therefore, there is an array of equal size segments on the film strip 26 with each segment containing a reduced size intermediate image corresponding to a different original 22.

However, it is contemplated that the apparatus 20 could be operated in such a matter as to transfer only an image of a single original 22 to the film strip 26 at the exposure station 46 and to then index the film strip to move this image through the developing station 48 to the transfer station 50. At the transfer station 50, the image would be transmitted to photosensitive material 24 to form a single printing plate or other article. The film strip would then be wound onto the storage roll 31. Of course, this would result in a substantial portion film strip 26 being blank between adjacent images.

During operation of the apparatus 20 to sequentially expose printing plates 24 of photosensitive material to images of different originals 22 at the exposure station 46, the film strip 26 is indexed in the forward direction 36 and in the opposite or reverse direction in a stepwise manner by rotation of the main drive sprocket 38 at a relatively low rate of speed. However, when the film strip is to be quickly indexed relative to the linear array 30 of stations, the motor for rotating the main drive sprocket 38 is operated by the controls 32 to move the film strip 26 in either a forward or reverse direction at relatively high speed.

In accordance with another feature of the invention, an image of an original 22 is transferred to and from the film strip or other known carrier 26 by electrophotography, that is, by using electricity and radiation. During operation of the illustrated apparatus 20, an electrostatic latent image is formed on the film strip 26 as the film strip is indexed through the exposure station 46 and a charging station 60 (FIGS. 1 and 2). In order to prevent dissipation of the charge on a segment of the film strip 40 while the apparatus 20 is inactive, a segment of the film strip 26 is moved from an initial or holding location 58 back through the charging station 60 to the exposure station 46. As the segment of the film strip 26 moves through the charging station 60 in the reverse direction, a charge is applied to the segment of the film strip. This eliminates the possiblity of a previously charged segment of the film strip 26 becoming partially discharged while it is at the exposure station 46 and the apparatus 20 is inactive.

As a segment of the film strip moves back through the charging station 60, a uniform positive electrostatic charge is applied to the segment of the film strip 26. At the exposure station 46, the positively charged segment of the film strip 26 is exposed to a light pattern corresponding to a selected original 22. Wherever the exposing light beam strikes the film strip 26, the electrostatic charge applied at the charging station 60 is discharged. This results in the formation of a latent electrostatic image of the original 22 on a segment of the film strip 26.

After the latent electrostatic image of the original 22 has been formed on a segment of the film strip 26 at the exposure station 48, the film strip is indexed in a forward direction to move the exposed segment of the film strip through the charging station 60 and initial or holding location 58 to the developing station 48. As the film strip is moved in a forward direction through the charging station 60, the charging station is inactive. Therefore, the electrostatic charge on the exposed segment of the film strip remains constant to maintain the latent electrostatic image of the original.

Although the charging station 60 has been shown as being downstream or after the exposure station 46 in FIGS. 1 and 2, it is contemplated that the charging station could be ahead of the exposure station if desired. If a segment of the film strip 26 is indexed through charging station 60 in a forward direction to the exposure station 46, a positive electrostatic charge would be applied to the segment of the film strip before it reached the exposure station. If the apparatus 20 is inactive for a substantial period of time, the charge on the segment of the film strip disposed at the exposure station 46 may tend to dissipate with the passage of time. Of course, this will tend to adversely effect the quality of the image projected onto the photosensitive material 24 at the transfer station 50.

The electrostatic latent intermediate image which is applied to a segment of the film strip at the exposure station 46 and charging station 60 is made visible and permanent at the developing station 48. The developing station 48 includes a toner substation 64 and a fusing substation 66. Positively charged toner particles are electrically attracted to discharged areas of the film strip 26 at the toner substation 64. The toner particles form a visible intermediate image which corresponds to and is smaller than the original 22. A dryer (not shown) is disposed between the toner substation 64 and fusing substation 66.

At the fusing substation 66, the toner particles are fused together and are fused with the material of the film strip 26 to form a permanent visible image corresponding to the original 22. The intermediate image formed by fusing the toner particles with the film strip 26 is durable and can be stored for a relatively long period of time on the storage roll 31. This enables the film strip 26 to be indexed from the storage roll 31 and used at a later time for forming a second printing plate 24.

A temporary storage station 70 is provided between the developing station 48 and transfer station 50. The temporary storage station 70 functions to temporarily hold a variable length of the film strip 26 until it is indexed to the transfer station 50. The length of the film strip 26 held at the storage station 70 can be increased from a relatively short length to a relatively long length during the exposure of a substantial number of originals 22 at the exposure station 46 with the transfer station 50 inactive. Subsequently, the length of the film strip 26 held at the storage station 70 can be reduced from a relatively long length to a relatively short length during transfer of a substantial number of images from the film strip to photosensitive material 24 of the transfer station 50 with the exposure station 46 inactive.

At the transfer station 50, an image on a segment of the film strip 26 is projected from the film strip onto photosensitive material 24. This is accomplished by transmitting radiation through the film strip 26 onto the plate 24 of photosensitive material. The radiation transmitted through the film strip 26 projects an enlarged image of the intermediate image on a segment of the film strip to the plate 24 of photosensitive material. The image projected onto the photosensitive material 24 corresponds to and may be larger, smaller or the same size as an original 22. The image projected onto the photosensitive material 24 may be smaller than the image on the film strip 26.

In order to enhance the quality of the image formed on the plate 24 of photosensitive material, ultraviolet radiation is transmitted through the film strip 26 to the photosensitive material 24. Although light of various wavelengths could be used, the ultraviolet light includes light of a wavelength between 365 and 450 nanometers. At the surface of the photosensitive material 24, the ultraviolet radiation has an energy level of at least 500 ergs per square centimeter. The quality of the image formed on the photosensitive material 24 is enhanced by using very high quality projection optics to transmit the image. Since the conventional offset plates 24 of photosensitive materials are relatively inexpensive, the consumable materials used to make a printing plate are relatively inexpensive.

The plate 24 of photosensitive material can be any one of many known, commerically available, plates intended for use in the forming of printing plates. When the surface of the plate 24 of photosensitive material is exposed to ultraviolet radiation having an energy level of at least 500 ergs per square centimeter, the plate undergoes a photochemcial reaction which causes a permanent change in physical properties of a polymeric composition or diazo compound forming an upper (as viewed in FIG. 1) layer on the plate. Development of the printing plate 24 is then completed in a known manner. The fully developed printing plate 24 is mounted in a printing press and used to print copies of an original on sheet material in a known manner.

Film Strip

In the illustrated embodiment of the invention, the carrier for an intermediate image of an original 22 is a film strip 26. The film strip 26 is a 105 mm organic photoconductor film. The film strip 26 has two series of openings along its opposite edges to receive sprockets at the supply roll 28, drive sprocket 38 (FIG. 2), and storage roll 32. This enables the film strip to be accurately indexed by rotation of the drive sprocket 38.

The film strip 26 includes a transparent and electrically insulating base 74 (FIG. 6) formed of a polyester material. A transparent conductive layer 76 is disposed over the base 74 and is connected to ground, in the manner indicated schematically in FIG. 6, at the supply roll 28 (FIG. 1). Thus, one end of the film strip 26 is mechanically clinched to a metal spool for the supply roll 28. The metal spool is grounded during the film loading step. The transparent conductive layer 76 acts as a ground electrode during the processing of the film strip 26 at the charging station 60, at the exposure station 46 and at the developing station 48.

A transparent photoconductive layer 78 (FIG. 6) of organic material is applied over the conductive layer 76. The purpose of the photoconductive layer 78 is to accept and hold an electrostatic charge in the dark, and then to discharge areas which are struck by an exposing light beam. Prior to being exposed to a light beam at the exposure station 46, the photoconductive layer 78 is electrically insulating. However, portions of the photoconductive layer which are struck by light beam at the exposure station 46 are rendered conducting.

When the photoconductive layer 78 is exposed at the exposure station 46 to a light pattern which corresponds to the original 22, the photoconductive layer is rendered electrically conducting in areas having a configuration which corresponds to the configuration of an image on the original 22. The photoconductive layer 78 is a solid solution of a suitably sensitized organic photoconductor. This transparent homogeneous layer does not have any of the crystalline structure associated with the emulsion layer of silver halide photographic materials. In one specific embodiment of the invention, the film strip 26 was Kodak Ektavolt (Trademark) recording film sold by the Eastman Kodak Company. Of course, equivalent film strips of a somewhat different construction and/or material could be utilized if desired. It should be understood that the photoconductive layer 78 faces downwardly in the embodiment of the invention shown in FIGS. 1-5 even though the photoconductive layer 78 is shown facing upwardly in FIGS. 6-9.

While it is preferred to use the film strip 26 as the carrier for an intermediate image of an original, other known carriers could be used if desired. Thus, a transparent plate covered by a thin coating of aluminum or carbon could be used as the carrier. If this was done, a laser could be used at the exposure station 46 to form an image of the original 22 on the transparent plate by vaporizing or melting the coating where a laser beam is directed against the coating. While it is preferred to use a single element as a carrier for an image the carrier could include a series of elements and the image could be transferred from one element of the carrier to succeeding element of the carrier. Of course, other known carriers could be used if desired.

Charging Station

Figure 6:
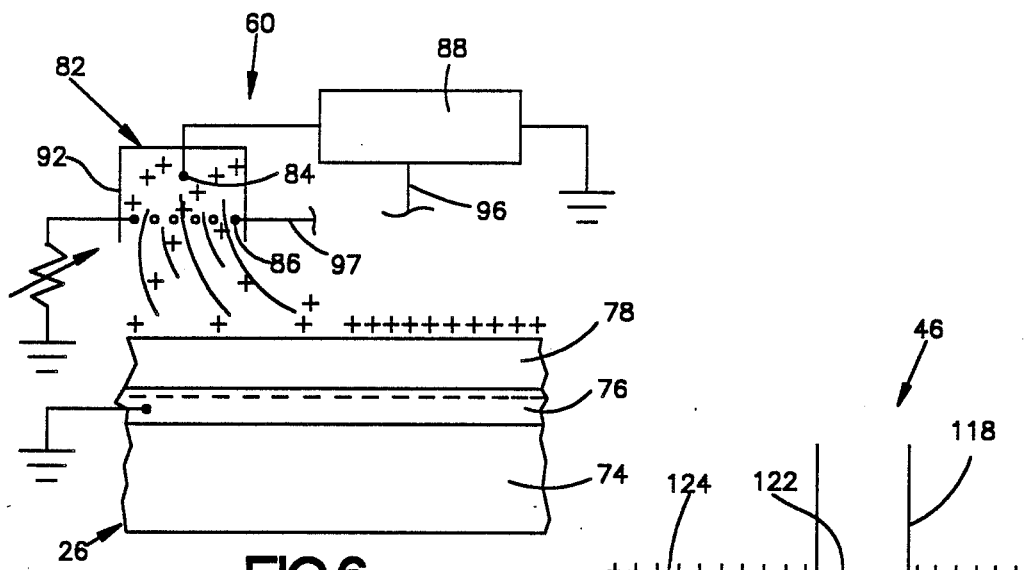
FIG. 6 is a highly schematized illustration depicting the manner in which a photoconductive layer on the film strip is charged at the charging station.

A uniform electrostatic charge is applied to the electrically insulating photoconductive layer 78 (FIG. 6) on the film strip 26 at the charging station 60. The charge is applied in the dark by a charger 82 having a corona wire 84 and a control grid 86. The corona wire is connected with a high voltage source 88, that is source 4,000 to 6,000 volts. The corona wire 84 produces positively charged ions. The positively charged ions, indicated schematically in FIG. 6, are electrically attracted to the photoconductive layer 78.

The corona charger 82 has a grounded shield 92 which improves control of the charging process by attracting corona current and providing stability. The control grid 86 modulates corona current. The operation of the power supplies for the corona charger 82 and control grid 86 are controlled by the computer controls 32 (FIG. 1). Thus, the high voltage source 88 is connected with the computer controls 32 by lead 96. The control grip 86 is connected with the controls 32 by lead 97.

Although the corona charger 82 has been shown in FIG. 6 as being above the film strip 26, it should be understood that the charging unit 60 is disposed below the film strip 26 in a manner illustrated in FIGS. 1 and 2. The photoconductive layer 78 forms the lowermost or bottom layer of the film strip 26 and the base or supporting layer 74 is the upper layer. Although the charging station 60 has been illustrated herein as being after the exposure station 46, the charging station could be disposed before the exposure station if desired.

Exposure Station

At the exposure station 46 (FIG. 1), a latent intermediate image which corresponds to and is smaller than an original 22 is formed on the downwardly facing photoconductive layer 78 of the film strip 26. To accomplish this, the film strip 26 is held flat by a vacuum head 100

(FIG. 2). Lights 102 and 104 are then turned on by the computer controls 32 through leads 106 and 108.

The computer controls 32 then effect operation of a shutter assembly 110 to enable light to be projected through a lens 112 to the film strip 26. To enable the shutter 110 to be actuated by the computer controls 32, the shutter is connected with the computer controls by a lead 114. Although the shutter cycle time will depend, in part at least, on the characteristics of a film strip 26, the shutter cycle time may range from 3 to 7.5 seconds.

Figure 7:
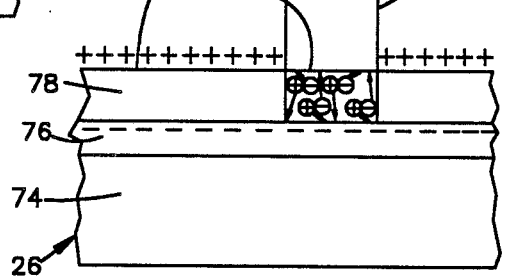
FIG. 7 is a highly schematized illustration depicting the manner in which portions of the photoconductive layer are rendered conducting by exposure to an original at the exposure station.

When a light beam 118 from the original 22 strikes the photoconductive layer 78, in the manner indicated schematically in FIG. 7, the light beam causes the photoconductive layer to become electrically conductive where the light beam strikes the photoconductive layer. The areas of the photoconductive layer 78 not struck by the exposing light 118 remain electrically nonconducting. In areas where the photoconductive layer 78 is rendered conducting by the exposing light pattern from the original 22, positive charges on the surface of the photoconductive layer 78 are attracted to the grounded conducting layer 76. Negative charges on the conducting layer 76 are attracted to the surface of the photoconductive layer 78 in the manner indicated schematically in FIG. 7.

The resulting charge pattern on the photoconductive 78 layer forms a latent intermediate image of reduced size and having a configuration which corresponds to the light pattern formed by the original 22 (FIG. 1).

Although the exposing light pattern 118 is illustrated schematically in FIG. 7 as originating from above the film strip 26, the exposing light pattern actually originates from below the film strip in the manner shown in FIGS. 1 and 2.

Developing Station

At the developing station 48, the latent intermediate image of the original 22 on the photoconductive layer 78 is made visible and permanent. Thus, positively charged toner particles are electrically attracted to conducting areas on the photoconductive layer 78 to form a visible intermediate image. The toner particles are fused with the material of the photoconductive layer 78 to make the visual image permanent.

Figure 8:
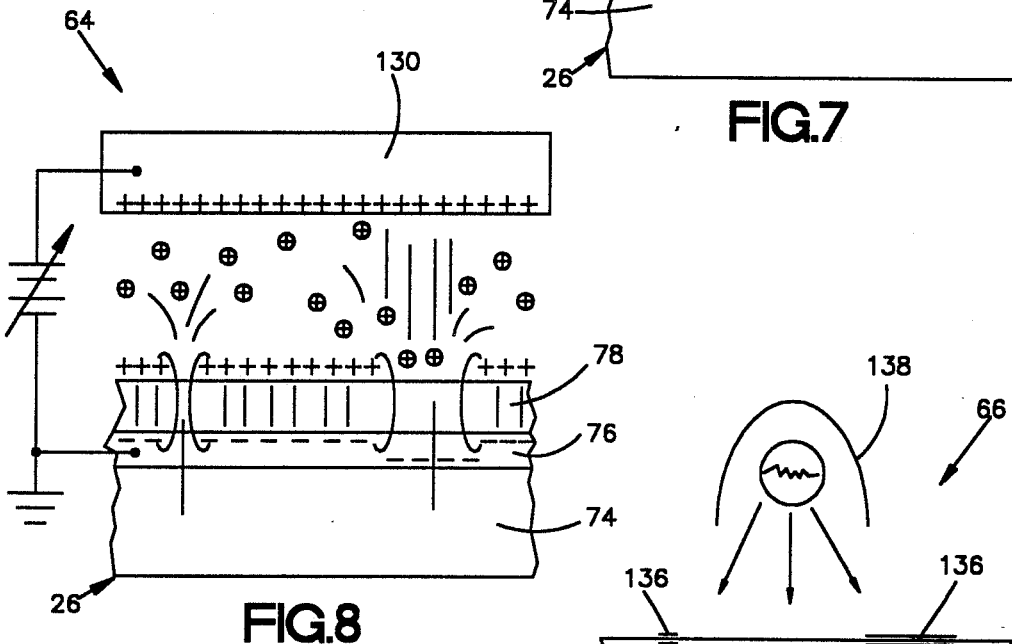
FIG. 8 is a highly schematized illustration depicting the manner in which toner particles are attracted to conducting areas of the photoconductive layer on the film strip at the developing station.

At the toner substation 64 (FIGS. 1, 2 and 8), positively charged toner particles are transmitted from a toner head 130 (FIGS. 2 and 8) to the photoconductive layer 78 on the film strip 26. The toner head 130 functions as a positively charged development electrode (FIG. 8). An electrostatic field is established between the toner head 130 and the conducting layer 76 at areas where the photoconductive layer 78 was rendered electrically conducting by exposure to the light pattern 118 (FIG. 7).

The positively charged toner particles from the toner head 130 (FIGS. 2 and 8) are electrically attracted to discharged areas of the photoconductive layer 78. This is because the discharged areas of the photoconductive layer 78 are adjacent to the conducting layer 76. The toner particles are repelled by the positively charged areas of the photoconductive layer 78 in the manner indicated schematically in FIG. 8. Thus, the toner particles adhere to a segment of the film strip 26 only in areas where light impinged against the film strip at the exposure station 46.

The discharged areas of the photoconductive layer 78 have a configuration corresponding to the configuration of the light pattern 118 transmitted from the original 22. Therefore, the opaque toner particles form a visible pattern which corresponds to the original 22 when the toner particles adhere to the conducting areas of the photoconductive layer 78. The computer controls 32 are connected with the toner substation 64 (see FIG. 1) by a lead 134 to enable the controls to regulate the strength of the electrical field between the development electrode 130 and the film strip 26. In addition, the computer controls 32 turn the toner head 130 off when the film strip 26 is being indexed in the reverse direction and/or when toner is not to be applied to a segment of the film strip at the toner substation 64.

Figure 9:
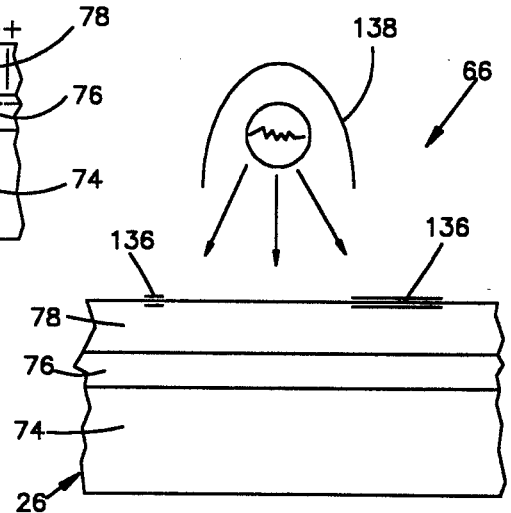
FIG. 9 is a highly schematized illustration depicting the manner in which toner particles are fused with the conductive layer at the developing station.

At the fusing substation 66 (FIGS. 1, 2, and 9), toner particles 136 are fused together and are fused with the material of the photoconductive layer 78 in the manner illustrated schematically in FIG. 9. Thus, an infrared lamp 138 at the fusing station 66 heats the toner particles to melt or fuse the toner particles together. During the fusing process, the toner particles also melt slightly into and fuse with the conductive layer 78 in the manner illustrated schematically in FIG. 9.

As the film strip 26 moves into the fusing substation 66, the film strip enters a fusing water tank 142 (FIG. 2). The film strip 26 is then exposed to the infrared lamp 138 by opening a shutter 144. Operation of the shutter 144 is controlled by the computer controls 32 (FIG. 1) over a lead 148.

When the shutter 144 is opened, the heat from the infrared lamp 138 fuses the particles of toner together. In addition, the heat from the infrared lamp fuses the particles of toner with the material of the film strip 26. This results in the formation of a permanent image on the film strip 26. It should be understood that the film strip 26 is transparent at locations where the opaque toner particles 136 do not block transmission of light through the film strip. Although the infrared lamp 138 is shown in FIG. 9 as exposing an upper side surface of the film strip 26, the infrared lamp 138 is exposed to a lower side of the film strip when it is in a vertical orientation in the fusing water tank 142 (FIG. 2).

Storage Station

After the film strip 26 leaves the fusing substation 66, the film strip is indexed to the temporary storage station 70 (FIG. 1). An open loop of the film strip 26 engages a vertically movable festoon roll 150 at the temporary storage station 70. An output from a position sensor connected with the festoon roll 150 is conducted over a lead 152 to the computer controls 32. This provides the computer controls 32 with an indication of the length of film awaiting advancement to the transfer station 50.

Although only a single festoon roll 150 has been illustrated in FIG. 1, there are a plurality of movable festoon rolls at the storage station 70. In one specific embodiment of the invention, there were five movable festoon rolls, corresponding to the roll 150, at the storage station 70. This enables the apparatus 20 to be operated to expose a large number of originals 22 at the exposure station 46 while the transfer station 50 remains inactive. Similarly, the apparatus 20 can be operated to transfer a large number of intermediate images from the film strip 26 to photosensitive material 24 while the exposure station 46 remains inactive.

Thus, if the apparatus 20 is operated to expose originals 22 while the transfer station 50 remains inactive, the length of the film strip 26 at the storage station 70 increases. If the apparatus 20 is then operated to transfer images from the film strip 26 to photosensitive material 24 while the exposure station 46 remains inactive, the length of the film strip at the storage station 70 decreases. If the apparatus is operated to expose originals 22 at the exposure station 46 at substantially the same rate as the transfer of images to photosensitive material 24 at the transfer station 50, the length of the film strip at the storage station 70 remains substantially constant.

The computer controls 32 (FIG. 1) regulate the operation of stepper motors (not shown) for film drive sprockets on opposite sides of the storage station 70 to control the feeding of the film strip 26 into and out of the storage station. Thus, when the film strip 26 is fed into the storage station under the influence of the weight of the festoon rolls and/or a drive sprocket on the input side of the storage station. When the film strip 26 is to be fed out of the storage station 70, a drive sprocket on the input side of the storage station is stationary and the film strip is fed out of the storage station against the weight of the festoon rolls 150 by the drive sprocket on the output side of the storage station.

Transfer Station

At the transfer station 50, light from a source 156 (FIGS. 1 and 4) is projected through transparent portions of the film strip 26 to the plate 24 of photosensitive material. The light activates the photoresist materials on the printing plate 24 to form an image corresponding to the original 22. As was previously mentioned, the plate 24 of photosensitive material can be either a printing plate, printed circuit board or other article. The photosensitive material 24 can be a photopolymer or diazo compound disposed on a suitable base. A photochemcial reaction is initiated when the surface of the photopolymer or diazo compound is exposed to radiant energy of a magnitude of at least 500 ergs per square centimeter.

Figure 5:
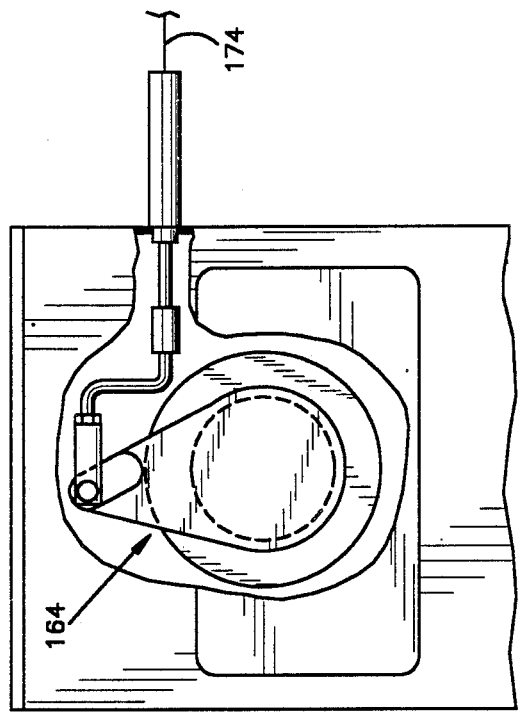
FIG. 5 is a fragmentary view, taken generally along the line 5—5 of FIG. 4, illustrating the construction of a shutter for controlling the transmission of radiation from the source through the film strip.

In the embodiment of the invention illustrated in FIGS. 3, 4, and 5, the high intensity source 156 of light is a mercury xenon short arc lamp (FIG. 4). The radiant energy from the lamp 156 is focused into a conical beam by a polished reflector 158. The light beam is transmitted from the polished reflector 158 to a dichroic mirror 160 (FIG. 4) which transmits infrared light and reflects the desired ultraviolet light. Thus, although the lamp 156 provides both ultraviolet radiation and radiation of a wavelength different than ultraviolet, only the ultraviolet radiation is reflected by the dichroic mirror 160.

The ultraviolet radiation is reflected from the mirror 160 through a shutter assembly 164 (FIGS. 4 and 5) to a lens systems 166 (FIG. 4) which homogenizes the light such that a nearly uniform plane of illumination is produced at a collector lens 170. Energization of the light source 156 and operation of the shutter 164 is controlled by the computer controls 32 (FIG. 1). Thus, the light source 156 is connected with the computer controls 32 by lead 172 and the shutter assembly 164 is connected with the computer control by lead 174.

After the radiant energy leaves the homogenizing lens system 176, it encounters a second dichroic mirror 178 (FIG. 4) which transmits infrared light and reflects ultraviolet light to the collecting lens 170. The ultraviolet light is transmitted from the collecting lens 170 through transparent areas of a segment of the film strip 26 to an imaging lens 182. The ultraviolet light from the imaging lens 182 is directed onto the plate 24 of photosensitive material.

The imaging lens 182 projects an enlarged image of the intermediate image on a segment of the film strip onto the photosensitive material 24. Although the projected image on the photosensitive material is larger than the intermediate image on the film strip 26, the projected image may be larger than the same size as, or smaller than an original 22. For certain purposes, such as making integrated circuitry, the image projected onto the photosensitive material may be smaller than the intermediate images on the film strip. The ultraviolet radiation pattern transmitted from the film strip 26 through the imaging lens 182 to the plate 24 of photosensitive material 24 has an energy level of at least 500 ergs per square centimeter at the flat upper surface of the photosensitive material 24. This radiant energy causes the photosensitive material on the plate to undergo a photochemical reaction and form an image of the original 22.

The photosensitive layer on the plate 24 is a photopolymerizable system wherein the ultraviolet light triggers the spontaneous reaction of monomers to form long polymer chains with a corresponding change in many physical properties of the system. The basic formulation of the photosensitive material may include a monomer, a polymeric thickner, a photoinitiator, and thermal stabilizer. A acrylate or methacrylate may be used as a monomer. A sharp and high quality image, corresponding to the image on the original 22, is formed on the photosensitive material on the plate 24.

Rather than being a photopolymer, the photosensitive layer on the plate 24 could be a diazo compound. The unexposed diazo compound is initially insoluble and becomes soluble in areas exposed to ultraviolet radiant energy at a level of at least 500 ergs per square centimeter. Therefore, a positive image results when soluble areas are washed away by developer.

At the exposure station 50, the film strip 26 moves through a body 190 of water or other liquid (FIGS. 3 and 4). The body 190 of water conducts heat away from the film strip 26, the film strip is cooled by the body of liquid. This prevents excessive heating and distortion of the film strip.

Although the forgoing description has considered each station in the linear array 30 of stations separately, it should be understood that operations may be simultaneously occurring, on different segments of the film strip 26, at each of the stations. The computer controls 32 coordinate operations at all of the stations to provide the resulting high quality image on the plate 24. When the plate 24 of photosensitive materials is a printing plate, the plate is subsequently mounted on the cylinder of a printing press. When the plate 24 of photosensitive material is a printed circuit board, electrical circuitry is subsequently connected with the plate in a known manner.

Conclusion

In view of the forgoing description, it is apparent that a new and improved method and apparatus 20 is provided to sequentially transfer images of originals 22 to plates 24 of photosensitive material. The photosensitive material 24 may be disposed on a base or plate and used in the making of an article such as a printing plate or printed circuit board. To transfer the image from an original 22 to a plate 24 of photosensitive material, a carrier 26 is moved along a path which extends through a linear array 30 of stations. An image of an original 22 may be formed on the carrier 26 in many different ways. In one embodiment of the invention, the intermediate image is formed on the carrier 26 by electrophotographic methods.

When electrophotographic methods are used to form an image on the carrier 26, the linear array 30 of stations includes a charging station 60 at which an electrostatic charge is applied to the carrier 26. At an exposure station 46, a photoconductive layer 78 on the carrier 26 is exposed to a light pattern which forms a latent intermediate image of reduced size and corresponding to an original 22. The light pattern renders areas of the photoconductive layer 78 electrically conducting to discharge them. At a developing station 48, toner particles 136 are electrically attracted to discharging areas of the photoconductive layer 78 to form a visible image. The toner particles 136 are fused with the material of the photoconductive layer 78 to make the visible image permanent.

At a transfer station 50, radiation is directed through the carrier 26 to project an enlarged image onto the photosensitive material 24. The quality of the image formed on the photosensitive material 24 is enhanced by exposing the photosensitive material to ultraviolet radiation at the transfer station 50. In order to cause a photochemical reaction to take place in the photosensitive material 24, the ultraviolet radiation has an energy level of at least 500 ergs per square centimeter at the surface of the photosensitive material. The photosensitive material 24 may be photopolymer, diazo compound or other known material in which a photochemcial reaction is intitiated by radiant energy of a magnitude of 500 ergs per square centimeter or more.

Although many different types of carriers could be used, in one embodiment of the invention, the carrier is a film strip 26 which extends from a supply roll 28 through the linear array of stations 60, 46, 48, 70 and 50 to the storage roll 30. Since a permanent image is formed on the film strip 26, the film strip can later be unwound from the storage roll 31 and used to form a second image on photosensitive material 24. The cost of transferring the copy of an original to photosensitive material 24 is relatively low since the materials which are consumed in the process are relatively inexpensive. The linear array of stations (60, 46, 48, 70, 50) through which the film strip 26 passes is compact and is easily adapted to computer controls 32 so that the apparatus 20 can be operated by a minimum number of personnel having minimal skills.

Having described specific preferred embodiments of the invention, the following is claimed:

1. A method of transferring an image to photosensitive material, said method comprising the steps of moving a carrier along a path extending through a linear array of stations which includes an image forming station and a transfer station, forming an intermediate image on the carrier at the image forming station, transferring an enlargement of the intermediate image on the carrier to the photosensitive material at the transfer station, said step of transferring an enlargement of the intermediate image to the photosensitive material including transmitting radiant energy through the carrier onto a surface of the photosensitive material with an energy level of at least 500 ergs per square centimeter at the surface of the photosensitive material.

2. A method as set forth in claim 1 wherein the photosensitive material includes a base and layer of a photopolymer on the base, said step of transmitting an enlargement of the intermediate image to the photosensitive material including initiating a photochemical reaction in the photopolymer under the influence of the radiant energy transmitted through the carrier onto a surface of the photopolymer.

3. A method as set forth in claim 1 wherein the photosensitive material includes a base and a layer of a diazo compound on the base, said step of transmitting an enlargement of an intermediate image to the photosensitive material including initiating a photochemical reaction in the diazo compound under the influence of radiant energy transmitted through the carrier onto the surface of the diazo compound.

4. A method as set forth in claim 1 wherein said step of transmitting radiant energy through the carrier includes transmitting radiant energy through liquid disposed on at least one side of the carrier and conducting heat from the carrier through the liquid.

5. A method as set forth in claim 1 wherein the photosensitive material includes a base and a layer of photosensitive material on the base, said method further including mounting the base in a printing press and transferring copies of an image on the layer of photosensitive material to sheets of material during operation of the printing press.

6. A method as set forth in claim 1 wherein the photosensitive material includes a base and a layer of photosensitive material on the base, said method further including connecting electrical circuitry with the base.

7. A method as set forth in claim 1 wherein said step of forming an intermediate image includes forming an intermediate image which is smaller in size than an original.

8. A method as set forth in claim 1 wherein said step of forming an intermediate image on the carrier at the image forming station includes projecting an image of an original onto the carrier.

9. A method as set forth in claim 1 wherein said step of transmitting radiant energy through the carrier onto the surface of the photosensitive material includes transmitting ultraviolet radiation through the carrier onto the surface of the photosensitive material.

10. A method as set forth in claim 1 wherein said step of transferring an enlargement of the intermediate image to the photosensitive material includes providing ultraviolet radiation and radiation of a wavelength different than ultraviolet, said step of transmitting radiant energy through the carrier including transmitting only ultraviolet radiation to the surface of the photosensitive material.

11. A method as set forth in claim 1 wherein said step of forming an intermediate image on the carrier includes the step of exposing a photoconductive layer of material on the carrier to a light pattern which forms an image of an original to render the photoconductive layer conductive where the light pattern strikes the photoconductive layer.

12. A method as st forth in claim 11 further including the step of applying a uniform electrostatic charge to the photoconductive layer on the carrier prior to performance of said step of exposing the photoconductive layer to a light pattern which forms an image of the original.

13. A method as set forth in claim 11 further including the step of retaining an electrostatic charge on nonconducting portions of the layer of photoconductive layer on the carrier.

14. A method as set forth claim 1 wherein the linear array of stations further includes a charging station and a developing station, said step of forming an intermediate image on the carrier includes forming a latent intermediate image on the carrier, said method further including applying an electrostatic charge to the carrier at the charging station and electrically attracting toner particles to the carrier at the developing station to develop the latent intermediate image.

15. A method as set forth in claim 14 further including the step of fusing the toner particles to the carrier at the developing station.

16. A method as set forth in claim 1 wherein the carrier is a film strip, said step of moving the carrier along a path extending through a linear array of stations includes moving the film strip from a film supply roll through the linear array of stations to a film storage roll, said step of forming an intermediate image on the carrier at the image forming station includes exposing a segment of the film strip to an original, said step of transmitting radiant energy through the carrier includes transmitting radiant energy through the segment of the film strip at the transfer station.

17. A method as set forth in claim 1 wherein the linear array of stations includes a charging station and a developing station which are disposed between the image forming and transfer stations, moving the carrier in a first direction through the charging station to the image forming station, applying a charge to at least a portion of the carrier as it moves through the charging station in the first direction to the image forming station, thereafter, performing said step of forming an intermediate image on the carrier by exposing the carrier to an original at the image forming station, said step of exposing the carrier to an original including discharging at least a portion of the charge on the carrier to form a latent image of the original on the carrier, thereafter, moving the carrier through the charging station in a second direction opposite to the first direction to a developing station, and developing the latent image on the carrier at the developing station.

18. A method comprising the steps of moving a carrier along a path extending through an exposure station, developing station and transfer station, exposing the carrier to originals at the exposure station by projecting reduced size images of the originals onto the carrier, developing images of the originals on the carrier at the developing station, and transferring enlarged images from the carrier to photosensitive material at the transfer station by exposing the photosensitive material to ultraviolet radiation transmitted through the carrier.

19. A method as set forth in claim 18 wherein said step of moving a carrier along a path includes moving the carrier through a linear array of stations which includes the exposure, developing and transfer stations.

20. A method as set forth in claim 18 wherein the carrier is a film strip, said step of moving the carrier along a path includes indexing the film strip in a first direction along the path, said method further including indexing the film strip along the path in a second direction opposite to the first direction to move a selected segment of the film strip back to the transfer station and, thereafter, transferring an image of an original from the selected film segment of the film strip to photosensitive material at the transfer station.

21. A method as set forth in claim 20 wherein said step of indexing the film strip along a path in the first direction includes moving the film strip in the first direction at a first speed, said step of indexing the film strip along a path in the second direction includes moving the film strip in the second direction at a second speed which is greater than the first speed.

22. A method as set forth in claim 18 further including the step applying an electrostatic charge to the carrier before performance of said step of exposing the carrier to originals, said step of exposing the carrier includes at least partially discharging the charge on the carrier at areas having configurations which are a function of an original to which the carrier is exposed.

23. A method as set forth in claim 18 wherein said step of transferring images of the originals from the carrier to the photosensitive material includes providing ultraviolet radiation and radiation of a wavelength different than ultraviolet, said step of exposing the photosensitive material to ultraviolet radiation includes directing only ultraviolet to the surface of the photosensitive material with an energy level of at least 500 ergs per square centimeter at the surface of the photosensitive material.

24. A method as set forth in claim 18 further including mounting the photosensitive material in printing presses and transferring copies of images on the photosensitive material to sheets of material during operation of the printing presses.

25. A method as set forth in claim 18 further including connecting electrical circuitry with the photosensitive material.

26. A method as set forth in claim 18 wherein said step of exposing the carrier to originals includes the step of exposing a photoconductive layer of material on the carrier to a light pattern which forms an image of an original to render the photoconductive layer conductive where the light pattern strikes the photoconductive layer.

27. A method as set forth in claim 26 further including the step of applying a uniform electrostatic charge to the photoconductive layer on the carrier prior to performance of said step of exposing the photoconductive layer to a light pattern which forms an image of the original.

28. A method as set forth in claim 26 further including the step of retaining an electrostatic charge on nonconducting portions of the layer of photoconductive material on the carrier after exposing the photoconductive layer to a light pattern which forms an image of the original.

29. A method as set forth in claim 18 wherein said step of moving the carrier along a path includes moving a portion of the carrier from an initial location to the exposure station, said step of exposing the carrier to originals including exposing the portion of the carrier to an original after having performed said step of moving a portion of the carrier from an initial location to the exposure station, said step of moving the carrier along the path further includes moving the portion of the carrier from the exposure station through the initial location to the developing station after the portion of the carrier has been exposed to an original at the exposure station.

30. A method comprising the steps of moving a carrier along a path extending through a charging station, exposure station, developing station and transfer station, applying an electrostatic charge to the carrier at the charging station, sequentially exposing segments of the carrier to originals at the exposure station, said steps of exposing segments of the carrier and applying an electrostatic charge to the carrier include providing a charge on each segment of the carrier in turn at areas having configurations which are a function of the original to which the segment of the carrier is exposed, sequentially developing images of the originals on the carrier at the developing station, and transferring images of the originals from the carrier to photosensitive material at the transfer station by directing radiation through the segments of the carrier to the photosensitive material.

31. A method as set forth in claim 30 wherein said step of sequentially developing images of the originals on the carrier at the developing station includes electrically attracting toner particles to uncharged areas on each segment of the carrier in turn.

32. A method as set forth in claim 31 wherein said step of transferring images of the originals from the carrier to the photosensitive material includes exposing the photosensitive material to ultraviolet radiation with an energy level of at least 500 ergs per square centimeter at the surface of the photosensitive material.

33. A method as set forth in claim 30 wherein said step of directing radiation through the segments of the carrier onto the photosensitive material includes providing ultraviolet radiation and radiation of a wavelength different than ultraviolet, and directing only the ultraviolet radiation onto the photosensitive material.

34. A method set forth in claim 30 wherein said step of applying an electrostatic charge to the carrier is performed before said step of exposing segments of the carrier to originals, said step of exposing segments of the carrier includes at least partially discharging the charge on each segment of the carrier in turn.

35. A method as set forth in claim 34 wherein said step of at least partially discharging the charge on each segment of the carrier includes exposing the carrier to a light pattern which forms an image of the original.

36. A method as set forth in claim 34 wherein said step of applying an electrostatic charge to the carrier includes the step of applying a uniform electrostatic charge to a photoconductive layer on the carrier, said step of at least partially discharging the charge on each segment of the carrier includes exposing the photoconductive layer of material to a light pattern which forms an image of the original to render the photoconductive layer conductive where the light pattern strikes the photoconductive layer.

37. A method as set forth in claim 30 wherein said step of applying an electrostatic charge to the carrier includes sequentially applying a charge to segments of the carrier during movement of the carrier through the charging station in a first direction, said method further including maintaining a charge on segments of the carrier substantially constant during movement of the segments of the carrier through the charging station in a second direction after having perform said step of exposing segments of this carrier to originals.

38. A method as set forth in claim 30 wherein said step of sequentially exposing segments of the carrier to originals at the exposure station includes the step of exposing a photoconductive layer on the carrier to a light pattern which forms an image which is a function of the original to render the photoconductive layer electrically conductive where the light pattern strikes the photoconductive layer.

39. A method as set forth in claim 38 wherein said step of sequentially developing images of the originals at the developing station includes electrically attracting toner particles to conducting areas of the photoconductive layer and fusing the toner particles with the material of the photoconductive layer.

40. A method as set forth in claim 38 wherein said step of sequentially developing images of the originals at the developing station includes electrically attracting toner particles to each segment of the carrier in turn and fusing the toner particles with the material of the carrier.

41. A method as set forth in claim 30 wherein the carrier is a film strip, said step of moving a carrier along a path includes indexing the film strip through a linear array of stations which includes the exposure, developing and transfer stations.

42. A method as set forth in claim 30 wherein the carrier is a film strip, said step of moving the carrier along a path includes indexing the film strip in a first direction, said method further including indexing the film strip along the path in a second direction opposite to the first direction to move a selected segment of the film strip from the storage roll back to the transfer station, thereafter, transferring an image of an original from the selected film segment to photosensitive material at the transfer station.

43. A method as set forth in claim 42 wherein said step of indexing the film strip along a path in the first direction includes moving the film strip along a path in the first direction at a first speed, said step of indexing the film strip along a path in the second direction includes moving the film strip in the second direction at a second speed which is greater than the first speed.

44. A method comprising the steps of indexing a film strip along a path which extends from a film supply roll through a plurality of stations disposed in a linear array to a storage roll, at one of the plurality of stations performing the step of sequentially exposing segments of a photoconductive layer on the film strip to light patterns which form images which are a function of originals to render areas of the photoconductive layer electrically conductive, at one of the plurality of stations performing the step of fusing the toner particles with the material of the photoconductive layer on the film strip, at one of the plurality of stations and after having performed said step of fusing the toner particles performing the step of directing radiation through each segment of the film strip in turn to a different body of a plurality of bodies of photosensitive material, and developing an image of a different one of the originals on each body of photosensitive material.

45. A method as set forth in claim 44 wherein said step of directing radiation through each of the segments of the film strip to bodies of photosensitive material includes exposing the bodies of photosensitive material to ultraviolet radiation.

46. A method as set forth in claim 44 wherein said step of directing radiation through each of the segments of the film strip to bodies of photosensitive material includes transmitting radiant energy to surfaces of the bodies of photosensitive material with an energy level of at least 500 ergs per square centimeter at the surfaces of the bodies of photosensitive material.

47. A method of comprising the steps indexing a film strip in a first direction along a path which extends from a film supply roll through a charging station, exposure station, developing station and transfer station to a film storage roll, moving one segment of the film strip from an initial location through the charging station to the exposure station during performance of said step of indexing the film strip in the first direction, applying a charge to the one segment of the film strip as it moves through the charging station during performance of said step of indexing the film strip in the first direction, thereafter, exposing the one segment of the film strip to an original at the exposure station, at least partially discharging the charge on the one segment of the film strip during said step of exposing the one segment of the film strip to an original, thereafter, indexing the film strip in a second direction along the path, moving the one segment of the film strip from the exposure station through the charging station toward the developing station during the indexing of the film strip in the second direction along the path, maintaining the charge on the one segment of the film strip substantially constant during movement of the one segment of the film strip through the charging station as the film strip is indexed in the second direction, developing an image of the original on the one segment of the film strip at the developing station, and transferring the image of the original from the film strip to photosensitive material at the transfer station by transmitting radiant energy through the film strip onto the photosensitive material.

48. A method as set forth in claim 47 wherein said steps of transmitting radiant energy through the film strip onto the photosensitive material includes transmitting radiant energy with an energy level of at least 500 ergs per square centimeter at the surface of the photosensitive material.

49. A method as set forth in claim 48 wherein said step of transmitting radiant energy through the film strip includes transmitting ultraviolet radiation through liquid disposed on at least one side of the film strip and conducting heat from the film strip through the liquid.

50. A method as set forth in claim 47 wherein said step of exposing the one segment of the film strip to an original at the exposure station includes exposing a photoconductive layer of material on the one segment of the film strip to a light pattern which forms an image of an original to render the photoconductive layer on the one segment of the film strip conductive where the light pattern strikes the photoconductive layer, said step of at least partially discharging the charge on the one segment of the film strip includes discharging the charge in areas where the photoconductive layer was rendered conductive by the light pattern which forms an image of an original.

51. An apparatus comprising a linear array of stations, means for moving a carrier along a path extending through each station of the linear array of stations, means for forming an intermediate image on the carrier at the image forming station, means for transferring an enlargement of the intermediate image on the carrier to photosensitive material at the transfer station, said means for transferring an enlargement of the intermediate image to the photosensitive material including means for transmitting radiant energy through the carrier onto a surface of the photosensitive material with an energy level of at least 500 ergs per square centimeter at the surface of the photosensitive material.

52. An apparatus as set forth in claim 51 wherein said means for transferring an enlargement of the intermediate image on the carrier to the photosensitive material includes a body of liquid which is disposed on at least one side of the carrier to conduct heat from the carrier.

53. An apparatus as set forth in claim 52 wherein said means for forming an intermediate image on the carrier at the image forming station includes projection means for projecting a reduced size image of an original onto the carrier.

54. An apparatus as set forth in claim 45 wherein said means for transferring an enlargement of the intermediate image on the carrier to the photosensitive material includes projector means for projecting an enlarged image of the intermediate image onto the photosensitive material.

55. An apparatus as set forth in claim 51 wherein the carrier is a film strip, said means for moving the carrier along a path includes reversible motor means operable to index the film strip in a first direction along the path and operable to index the film strip in a second direction along the path, said reversible motor means being operable in the first direction to index the film strip from a supply roll toward a storage roll, said reversible motor means being operable in the second direction to index the film strip from the storage roll back toward the supply roll.

56. An apparatus as set forth in claim 51 wherein said means for transferring an enlargement of the intermediate image on the carrier to the photosensitive material includes a source of ultraviolet radiation and of radiation of a wave length different than ultraviolet, and means for directing only radiation which has passed through the carrier and is ultraviolet to the photosensitive material.

57. An apparatus as set forth in claim 51 wherein said means for forming an intermediate image on the carrier includes means for exposing a photoconductive layer on the carrier to a light pattern which forms an image of an original to render the photoconductive layer conductive where the light pattern strikes the photoconductive layer.

58. An apparatus as set forth in claim 57 further including charging means for applying a uniform electrostatic charge to the photoconductive layer on the carrier prior to exposing the photoconductive layer to a light pattern which forms an image of the original.

59. An apparatus as set forth in claim 57 further including means for retaining an electrostatic charge on nonconducting portions of the layer of photoconductive material on the carrier after the photoconductive layer has been exposed to a light pattern which forms an image of the original.

60. An apparatus comprising means for indexing a film strip along a path extending from a film supply roll through a linear array of stations including a charging station, exposure station, developing station and transfer station, means at the charging station for applying an electrostatic charge to the film strip, means at the exposure station for sequentially exposing segments of the film strip to originals, said means for applying an electrostatic charge to the film strip and said means for exposing segments of the film strip to originals including means for providing a charge on each segment of the film strip in turn at areas having configurations which are a function of the original to which the film segment is exposed, means at the developing station for sequentially de eloping images of the originals on the film strip, and means at the transfer station for transferring images of the originals from the film strip to photosensitive material by directing radiation through the segments of the film strip to the photosensitive material.

61. An apparatus as set forth in claim 60 wherein said means for developing images of the originals at the developing station includes means for electrically attracting toner particles to charged areas on each segment of the film strip in turn.

62. An apparatus as set forth in claim 60 wherein said means for transferring images of the originals from the film strip to photosensitive material includes means for exposing the photosensitive material to ultraviolet radiation.

63. An apparatus as set forth in claim 60 wherein said means for applying an electrostatic charge to the film strip includes means for applying a uniform electrostatic charge to a photoconductive layer on the film strip, said means for exposing segments of the film strip to originals including means for at least partially discharging the charge on each segment of the film strip by exposing the photoconductive layer of material on the film strip to a light pattern which forms an image of the original to render the photoconductive layer electrically conducting where the light pattern strikes the photoconductive layer.

64. An apparatus as set forth in claim 60 wherein said means for developing images of the originals at the developing station includes means for electrically attracting toner particles to charged areas on each segment of the film strip in turn and means for fusing the toner particles with the material of the film strip.

65. An apparatus comprising means for moving a carrier along a path extending through an exposure station, developing station and transfer station, means for sequentially exposing segments of the carrier to originals at the exposure station, means for sequentially developing images of the originals on the carrier at the developing station, and means for sequentially transmitting images of the originals from the carrier to photosensitive material at a transfer station by exposing the photosensitive material to ultraviolet radiation.

66. An apparatus as set forth in claim 65 wherein the means for transmitting images of the originals to photosensitive material includes means for transmitting radiation through each of the segments of the carrier in turn.

67. An apparatus as set forth in claim 65 wherein said means for moving a carrier along a path includes means for moving the carrier through a linear array of stations which includes the exposure, developing and transfer stations.

68. An apparatus as set forth in claim 65 wherein the carrier is a film strip, said means for moving the carrier along a path includes reversible motor means operable to index the film strip in a first direction along the path and operable to index the film strip in a second direction along the path, said reversible motor means being operable in the first direction to index the film strip from a supply roll toward a storage roll, said reversible motor means being operable in the second direction to index the film strip from the storage roll back toward the supply roll.

69. An apparatus as set forth in claim 65 wherein said means for transferring images of the originals from the carrier to the photosensitive material includes a source of ultraviolet radiation and of radiation of a wave length different than ultraviolet, and means for directing only radiation which has passed through the carrier and is ultraviolet to the photosensitive material.

70. An apparatus as set forth in claim 65 wherein said means for exposing segments of the carrier to originals includes means for exposing a photoconductive layer on the carrier to a light pattern which forms an image of the original to render the photoconductive layer conductive where the light pattern strikes the photoconductive layer.

71. An apparatus as set forth in claim 70 further including charging means for applying a uniform electrostatic charge to the photoconductive layer on the carrier prior to exposing the photoconductive layer to a light pattern which forms an image of the original.

* * * * *

UNITED STATES PATENT AND TRADEMARK OFFICE
CERTIFICATE OF CORRECTION

PATENT NO. : 4,894,679

DATED : January 16, 1990

INVENTOR(S) : Ervin J. Rachwal, George DeClaire, Frederick J. Elia

It is certified that error appears in the above-identified patent and that said Letters Patent is hereby corrected as shown below:

Column 14, Line 65, Claim 13, Change "layer" to --material--.

Column 16, Line 16, Claim 23, Insert --radiation-- after "ultraviolet" and before "to".

Column 17, Line 55, Claim 37, Change "perform" to --performed--.

Column 17, Line 56, Claim 37, Change "this" to --the--.

Column 20, Line 61, Claim 60, Change "de eloping" to --developing--.

Signed and Sealed this

Twenty-third Day of April, 1991

Attest:

HARRY F. MANBECK, JR.

Attesting Officer

Commissioner of Patents and Trademarks